(12) United States Patent
Kim et al.

(10) Patent No.: US 8,859,383 B2
(45) Date of Patent: Oct. 14, 2014

(54) METHOD OF FABRICATING SEMICONDUCTOR DEVICE HAVING DIELECTRIC LAYER WITH IMPROVED ELECTRICAL CHARACTERISTICS

(75) Inventors: Youn-soo Kim, Yongin-si (KR); Jae-hyoung Choi, Hwaseong-si (KR); Kyu-ho Cho, Hwaseong-si (KR); Wan-don Kim, Yongin-si (KR); Jae-soon Lim, Seoul (KR); Sang-yeol Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 36 days.

(21) Appl. No.: 13/424,825

(22) Filed: Mar. 20, 2012

(65) Prior Publication Data
US 2012/0178254 A1    Jul. 12, 2012

Related U.S. Application Data

(62) Division of application No. 12/585,030, filed on Sep. 1, 2009.

(30) Foreign Application Priority Data

Feb. 6, 2009    (KR) ................ 10-2009-0009875

(51) Int. Cl.
| | |
|---|---|
| H01L 21/20 | (2006.01) |
| H01L 49/02 | (2006.01) |
| H01L 21/02 | (2006.01) |
| H01L 21/316 | (2006.01) |
| H01L 21/318 | (2006.01) |
| H01L 27/108 | (2006.01) |

(52) U.S. Cl.
CPC ................ *H01L 28/40* (2013.01); *H01L 28/75* (2013.01); *H01L 21/02247* (2013.01); *H01L 21/31683* (2013.01); *H01L 27/1085* (2013.01); *H01L 21/02244* (2013.01); *H01L 21/022* (2013.01); *H01L 21/318* (2013.01); *H01L 21/02189* (2013.01)
USPC ....... 438/381; 438/210; 438/329; 257/E21.09

(58) Field of Classification Search
USPC .......... 438/244, 253, 387, 396, 210, 329, 381
See application file for complete search history.

(56) References Cited

U.S. PATENT DOCUMENTS

| | | | |
|---|---|---|---|
| 5,702,970 A | 12/1997 | Choi | |
| 6,201,276 B1 * | 3/2001 | Agarwal et al. ............... | 257/315 |
| 2004/0061157 A1 | 4/2004 | Kiyotoshi et al. | |

(Continued)

FOREIGN PATENT DOCUMENTS

| | | |
|---|---|---|
| CN | 1492510 A | 4/2004 |
| CN | 1624869 A | 6/2005 |

(Continued)

*Primary Examiner* — Samuel Gebremariam
(74) *Attorney, Agent, or Firm* — Lee & Morse, P.C.

(57) ABSTRACT

A semiconductor device having a dielectric layer with improved electrical characteristics and associated methods, the semiconductor device including a lower metal layer, a dielectric layer, and an upper metal layer sequentially disposed on a semiconductor substrate and an insertion layer disposed between the dielectric layer and at least one of the lower metal layer and the upper metal layer, wherein the dielectric layer includes a metal oxide film and the insertion layer includes a metallic material film.

19 Claims, 10 Drawing Sheets

(56) References Cited

U.S. PATENT DOCUMENTS

| | | |
|---|---|---|
| 2004/0104420 A1 | 6/2004 | Coolbaugh et al. |
| 2005/0227432 A1* | 10/2005 | Choi et al. .................... 438/244 |
| 2006/0006449 A1 | 1/2006 | Jeong et al. |
| 2006/0124987 A1 | 6/2006 | Won et al. |

FOREIGN PATENT DOCUMENTS

| | | |
|---|---|---|
| CN | 1741271 A | 3/2006 |
| JP | 2004-079931 A | 3/2004 |
| KR | 10-0360150 B1 | 10/2002 |
| KR | 10-2006-0008030 A | 1/2006 |

* cited by examiner

METHOD OF FABRICATING SEMICONDUCTOR DEVICE HAVING DIELECTRIC LAYER WITH IMPROVED ELECTRICAL CHARACTERISTICS

CROSS REFERENCE TO RELATED APPLICATION

This is a divisional application based on pending application Ser. No. 12/585,030, filed Sep. 1, 2009, the entire contents of which is hereby incorporated by reference.

BACKGROUND

1. Field

Embodiments relate to a semiconductor device having a dielectric layer with improved electrical characteristics and associated methods.

2. Description of the Related Art

Various dielectric layers may be used during fabrication of semiconductor devices. A dielectric layer may be formed between an upper electrode and a lower electrode of a capacitor. Diverse research is being conducted into improving characteristics of a dielectric layer, e.g., increasing the dielectric constant, improving crystallinity, and/or reducing defects, to thereby improve electrical characteristics of resultant semiconductor devices.

The crystallinity of the dielectric layer may be improved by, e.g., depositing the dielectric layer at a high temperature or heat-treating the dielectric layer after deposition. In addition, defects in the dielectric layer may be removed by, e.g., oxygen curing after the dielectric layer is formed.

SUMMARY

Embodiments are directed to a semiconductor device having a dielectric layer with improved electrical characteristics and associated methods, which substantially overcome one or more of the drawbacks, limitations, and/or disadvantages of the related art.

It is a feature of an embodiment to provide a semiconductor device having a dielectric layer with improved electrical characteristics.

It is another feature of an embodiment to provide a semiconductor device that reduces a leakage current.

At least one of the above and other features and advantages may be realized by providing a semiconductor device including a lower metal layer, a dielectric layer, and an upper metal layer sequentially disposed on a semiconductor substrate, and an insertion layer disposed between the dielectric layer and at least one of the lower metal layer and the upper metal layer, wherein the dielectric layer includes a metal oxide film and the insertion layer includes a metallic material film.

The insertion layer may be disposed between the dielectric layer and the lower metal layer.

The insertion layer may be disposed between the dielectric layer and the upper metal layer.

The insertion layer may be disposed between the dielectric layer and the lower metal layer and between the dielectric layer and the upper metal layer.

The metal oxide film and the metallic material film may each independently include at least one of Li, Be, B, Na, Mg, Al, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Pb, Bi, Po, Fr, Ra, and Ac.

The metal oxide film may be in the form of $MO_x$, wherein M is a metal, O is oxygen, and x is about 0.5 to about 4.

A metal used to form the metallic material film of the insertion layer may be the same as a metal used to form the metal oxide film of the dielectric layer.

The metallic material film of the insertion layer may be a metal oxide film.

The metallic material film of the insertion layer may be a metal nitride film.

At least one of the above and other features and advantages may also be realized by providing a method of fabricating a semiconductor device including sequentially forming a lower metal layer, a dielectric layer, and an upper metal layer on a semiconductor substrate, and forming an insertion layer between the dielectric layer and at least one of the lower metal layer and the upper metal layer, wherein the dielectric layer is formed of a metal oxide film and the insertion layer is formed of a metallic material film.

The forming the insertion layer may include forming the insertion layer between the dielectric layer and the lower metal layer.

The forming the insertion layer may include forming the insertion layer between the dielectric layer and the upper metal layer.

The forming the insertion layer may include forming the insertion layer between the dielectric layer and the lower metal layer and between the dielectric layer and the upper metal layer.

The forming the insertion layer may include forming an insertion material layer on the lower metal layer, and converting the insertion material layer to the insertion layer while the dielectric layer is formed on the insertion material layer.

The insertion material layer may include a metal film, a metal carbide film, or a metal nitride film.

At least one of the above and other features and advantages may also be realized by providing a method of fabricating a semiconductor device including forming a lower metal layer on a semiconductor substrate, forming a dielectric layer on the lower metal layer using a metal oxide film, forming an insertion material layer on the dielectric layer, and forming an upper metal layer on the insertion material layer, wherein forming the upper metal layer includes converting the insertion material layer to an insertion layer.

The insertion material layer may include a metal film, a metal carbide film, or a metal nitride film.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
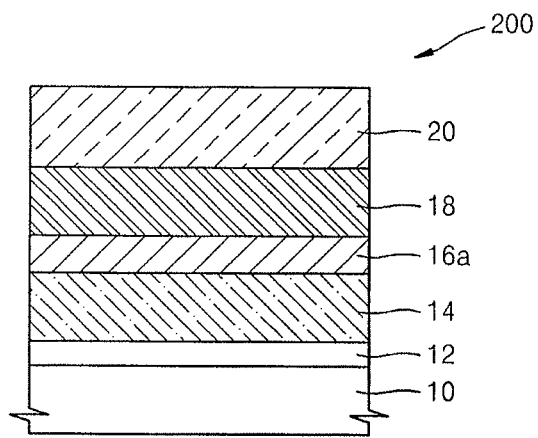
FIG. 1 illustrates a cross-sectional view of a semiconductor device according to a first embodiment.

Korean Patent Application No. 10-2009-0009875, filed on Feb. 6, 2009, in the Korean Intellectual Property Office, and entitled: "Semiconductor Device for Improving Electrical Characteristics of Dielectric Layer and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A semiconductor device according to an embodiment may be fabricated by forming an insertion layer in a first position between a lower metal layer and a dielectric layer, a second position between the dielectric layer and an upper metal layer, or in both of the first and second positions. The first position may be an interface between the lower metal layer and the dielectric layer. The second position may be an interface between the dielectric layer and the upper metal layer.

The lower metal layer may include, e.g., a metal nitride film. The dielectric layer may include, e.g., a metal oxide film. The insertion layer may include, e.g., a metallic material film.

If the insertion layer is formed between the lower metal layer and the dielectric layer, i.e., in the first position, formation of an undesirable interface layer due to oxidation of the lower metal layer during formation of the dielectric layer may be inhibited. In addition, the insertion layer may function as a seed layer during formation of the dielectric layer to, e.g., improve characteristics of the dielectric layer. If the insertion layer is formed between the dielectric layer and the upper metal layer, i.e., in the second position, the formation of an undesirable interface layer on the dielectric layer may be inhibited. Thus, the dielectric layer may not be damaged, thereby improving characteristics of the dielectric layer. The semiconductor device and a method of fabricating the semiconductor device will be described with reference to the accompanying drawings, in which exemplary embodiments are shown.

First Embodiment

FIG. 1 illustrates a cross-sectional view of a semiconductor device 200 according to the first embodiment. The semiconductor device 200 according to the first embodiment may include a lower structure, e.g., an insulating layer 12, on a semiconductor substrate 10. Instead of the insulating layer 12, a material layer or a transistor may be formed on the semiconductor substrate 10. A lower metal layer 14 may be formed on the semiconductor substrate 10 or on the insulating layer 12. The lower metal layer 14 may include, e.g., a metal nitride film. The metal nitride film may include, e.g., a titanium nitride (TiN) film, a niobium nitride (NbN) film, or a tantalum nitride (TaN) film.

A first insertion layer 16a and a dielectric layer 18 may be formed sequentially on the lower metal layer 14 in the order stated. The first insertion layer 16a may be formed in the first position between the lower metal layer 14 and the dielectric layer 18. The first insertion layer 16a may improve electrical characteristics of the dielectric layer 18, advantageously reducing leakage current.

The dielectric layer 18 may include, e.g., a metal oxide film. A metal M used to form the metal oxide film of the dielectric layer 18 may include, e.g., Li, Be, B, Na, Mg, Al, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Pb, Bi, Po, Fr, Ra, and/or Ac. The dielectric layer 18 may include, e.g., a single film including the metal M or multiple films including at least two films. The dielectric layer 18 may include the metal M in the form of $MO_x$, wherein O is oxygen and x is about 0.5 to about 4. The dielectric layer 18 may include, e.g., a zirconium oxide ($ZrO_2$) film.

The first insertion layer 16a may include, e.g., a metallic material film. The metallic material film of the first insertion layer 16a may include, e.g., a metal oxide film or a metal nitride film. The metal M used to form the metallic material film of the first insertion layer 16a may be the same as the metal M used to form the metal oxide film of the dielectric layer 18. Alternatively, the metal M used to form the metallic material film of the insertion layer 16a may be different from the metal M used to form the metal oxide film of the dielectric layer 18.

In particular, if the metal M used to form the metallic material film of the first insertion layer 16a is the same as the metal M used to form the metal oxide film of the dielectric layer 18, characteristics of the interface between the lower metal layer 14 and the dielectric layer 18 may be improved. Thus, the dielectric layer 18 may have excellent characteristics, improving electrical characteristics of the dielectric layer 18.

The first insertion layer 16a may include, e.g., a ZrO₂ film. If the first insertion layer 16a includes zirconium, and the dielectric layer 18 includes a ZrO₂ film, characteristics of the dielectric layer 18 may be improved, thereby improving electrical characteristics of the dielectric layer 18.

An upper metal layer 20 may be formed on the dielectric layer 18. The upper metal layer 20 may be formed of the same material used to form the lower metal layer 14.

The semiconductor device 200 according to the first embodiment may include the lower metal layer 14, the dielectric layer 18, and the upper metal layer 20, which may be sequentially formed on the semiconductor substrate 10 in the order stated. In particular, in the semiconductor device 200 of the first embodiment, the first insertion layer 16a may be formed in the first position between the lower metal layer 14 and the dielectric layer 18. The dielectric layer 18 may include, e.g., a metal oxide film, and the first insertion layer 16a may include, e.g., a metallic material film. The dielectric layer 18 of the semiconductor device 200 according to the first embodiment may have excellent electrical characteristics, thereby reducing leakage current.

The semiconductor device 200 according to the first embodiment may include a capacitor including the lower metal layer 14, the first insertion layer 16a, the dielectric layer 18, and the upper metal layer 20. The capacitor may be used in various integrated circuit semiconductor devices, e.g., dynamic random access memory (DRAM) devices.

Second Embodiment

Figure 2:
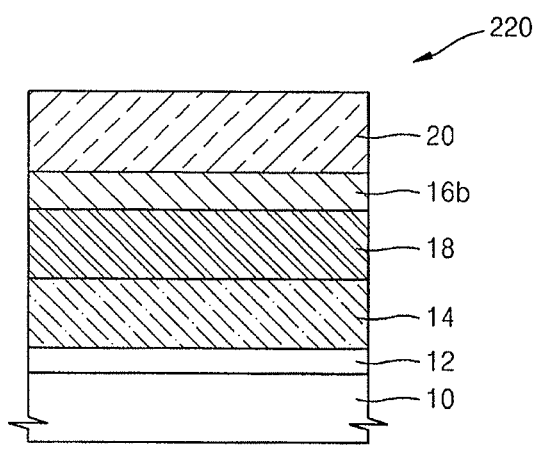
FIG. 2 illustrates a cross-sectional view of a semiconductor device according to a second embodiment.

FIG. 2 illustrates a cross-sectional view of a semiconductor device 220 fabricated according to the second embodiment. The semiconductor device 220 according to the second embodiment may be the same as the semiconductor device 200 according to the first embodiment, except that a second insertion layer 16b may be formed between the upper metal layer 20 and the dielectric layer 18, rather than forming the first insertion layer 16a between the lower metal layer 14 and the dielectric layer 18.

In particular, the lower metal layer 14 may be formed on a semiconductor substrate 10 or on a insulating layer 12. The lower metal layer 14 may include a metal nitride film, e.g., a TiN film, a NbN film, or a TaN film, as described above with reference to the first embodiment. The dielectric layer 18 may be formed on the lower metal layer 14. The dielectric layer 18 may include a metal oxide film, as described above with reference to the first embodiment. The metal M used to form the metal oxide film of the dielectric layer 18 may be the same as the metal M described above with reference to the first embodiment. The dielectric layer 18 may include a metal oxide in the form of $MO_x$, where M is the metal, O is oxygen, and x is about 0.5 to about 4. The dielectric layer 18 may include, e.g., a ZrO₂ film.

The second insertion layer 16b may be formed on the dielectric layer 18. The second insertion layer 16b may improve electrical characteristics of the dielectric layer 18, thereby reducing leakage current. The second insertion layer 16b may be formed of the same material used to form the first insertion layer 16a of the first embodiment. That is, the second insertion layer 16b may include, e.g., a metallic material film.

The metallic material film of the second insertion layer 16b may include, e.g., a metal oxide film or a metal nitride film. The metal M used to form the metallic material film of the second insertion layer 16b may also be different from the metal used to form the metal oxide film of the dielectric layer 18.

If the metal M used to form the metallic material film of the second insertion layer 16b is the same as the metal M used to form the metal oxide film of the dielectric layer 18, characteristics of the interface between the upper metal layer 20 and the dielectric layer 18 may be improved. Thus, the dielectric layer 18 may have excellent characteristics. Accordingly, electrical characteristics of the dielectric layer 18 may also be improved. The second insertion layer 16b may include, e.g., a zirconium nitride (ZrN) film. The upper metal layer 20 may be formed on the second insertion layer 16b. The upper metal layer 20 may be formed of the same material used to form the lower metal layer 14.

The semiconductor device 220 according to the second embodiment may include the second insertion layer 16b formed in the second position between the dielectric layer 18 and the upper metal layer 20. The dielectric layer 18 of the semiconductor device 220 according to the second embodiment may have improved electrical characteristics, thereby reducing leakage current.

The semiconductor device 220 according to the second embodiment may include a capacitor including, e.g., the lower metal layer 14, the dielectric layer 18, the second insertion layer 16b, and the upper metal layer 20. The capacitor may be used in various integrated circuit semiconductor devices, e.g., DRAM devices.

Third Embodiment

Figure 3:
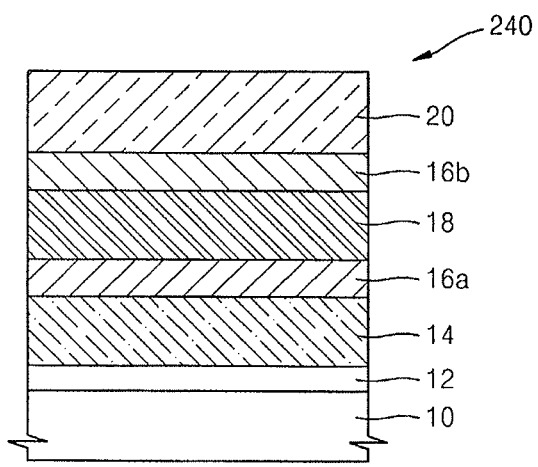
FIG. 3 illustrates a cross-sectional view of a semiconductor device according to a third embodiment.

FIG. 3 illustrates a cross-sectional view of a semiconductor device 240 fabricated according to the third embodiment. The semiconductor device 240 according to the third embodiment may be a combination of the semiconductor device 200 according to the first embodiment and the semiconductor device 220 according to the second embodiment. That is, the semiconductor device 240 according to the third embodiment may include the first insertion layer 16a formed in the first position between the lower metal layer 14 and the dielectric layer 18 and the second insertion layer 16b formed in the second position between the dielectric layer 18 and the upper metal layer 20.

In particular, the lower metal layer 14 may be formed on the semiconductor substrate 10 or on the insulating layer 12. The lower metal layer 14 may include a metal nitride film, e.g., a TiN film, a NbN film, or a TaN film, as described above with respect to the first and second embodiments.

The first insertion layer 16a may be formed on the lower metal layer 14 and the dielectric layer 18 may be formed on the first insertion layer 16a. The first insertion layer 16a may be the same as the insertion layer 16a of the first embodiment. The dielectric layer 18 may include a metal oxide film, as described in the first and second embodiments. The metal M used to form the metal oxide film of the dielectric layer 18 may be the same as the metal M described with respect to the first and second embodiments. The dielectric layer 18 may include the metal oxide in the form of $MO_x$, where M is the metal, O is oxygen, and x is about 0.5 to 4. The dielectric layer 18 may include, e.g., a ZrO₂ film.

The first insertion layer 16a may include a metallic material film. The metallic material film of the first insertion layer 16a may include, e.g., a metal oxide film or a metal nitride film. The metal M used to form the metallic material film of the first insertion layer 16a may be the same as or different from the metal M used to form the metal oxide film of the dielectric layer 18. The first insertion layer 16a may include, e.g., a ZrO₂ film. The first insertion layer 16a may improve electrical characteristics of the dielectric layer 18, thereby reducing leakage current.

The second insertion layer 16b and the upper metal layer 20 may be formed sequentially on the dielectric layer 18 in the order stated. The second insertion layer 16b may be formed of the same material used to form the second insertion layer 16b according to the second embodiment. The second insertion layer 16b may improve electrical characteristics of the dielectric layer 18, thereby reducing leakage current. The upper metal layer 20 may be formed of the same material used to form the lower metal layer 14.

In the semiconductor device 240 according to the third embodiment, the first insertion layer 16a may be formed in the first position between the lower metal layer 14 and the dielectric layer 18. The second insertion layer 16b may be formed in the second position between the dielectric layer 18 and the upper metal layer 20. The dielectric layer 18 of the semiconductor device 240 according to the third embodiment may have improved electrical characteristic, thereby reducing leakage current.

The semiconductor device 240 according to the third embodiment may include a capacitor including the lower metal layer 14, the first insertion layer 16a, the dielectric layer 18, the second insertion layer 16b, and the upper metal layer 20. The capacitor may be used in various integrated circuit semiconductor devices, e.g., DRAM devices.

Comparison of the First Embodiment and the First Comparative Embodiment

Hereinafter, characteristics of the dielectric layer 18 of the semiconductor device 200 according to the first embodiment, in which the insertion layer 16a may be formed between the lower metal layer 14 and the dielectric layer 18, will be compared with characteristics of the dielectric layer 18 of a semiconductor device according to the first comparative embodiment. In the first comparative embodiment, the dielectric layer 18 may be formed directly on the lower metal layer 14. In the semiconductor device 200 of the first embodiment, a TiN film may be used as the lower metal layer 14, a $ZrO_2$ film may be used as the insertion layer 16a, and a $ZrO_2$ film may be used as the dielectric layer 18. In the semiconductor device of the first comparative embodiment, a TiN film may be used as the lower metal layer 14 and a $ZrO_2$ film may be used as the dielectric layer 18.

Figure 4:
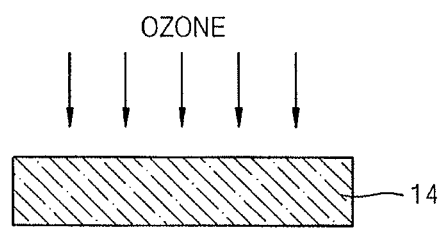
FIGS. 4 and 5 illustrate cross-sectional views of a semiconductor device according to a first comparative embodiment.
Figure 5:
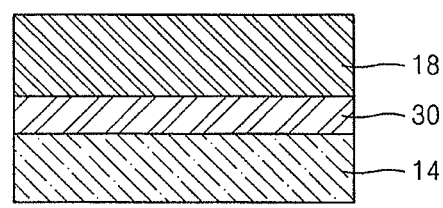
Figure 6:
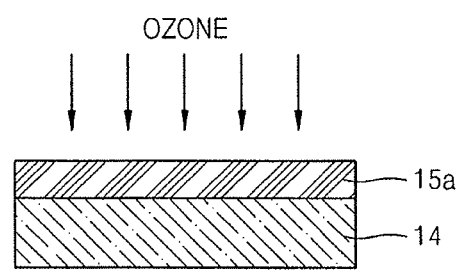
FIGS. 6 and 7 illustrate cross-sectional views of the semiconductor device according to the first embodiment.
Figure 7:
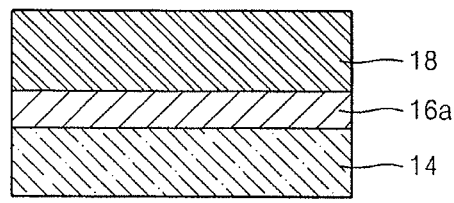

FIGS. 4 and 5 illustrate cross-sectional views of a semiconductor device according to the first comparative embodiment for comparison with the semiconductor device 200 according to the first embodiment. FIGS. 6 and 7 illustrate cross-sectional views of the semiconductor device 200 according to the first embodiment for comparison with the semiconductor device according to the first comparative embodiment.

In particular, according to the first comparative embodiment as shown in FIGS. 4 and 5, a dielectric layer 18, e.g., a $ZrO_2$ film, may be formed on a lower metal layer 14, e.g., a TiN film. According to the fabrication process, the lower metal layer 14 may be oxidized by an ozone ($O_3$) oxidant, used to form the dielectric layer 18, to form an interface layer 30, e.g., a $TiO_x$ layer or a TiON layer, on the lower metal layer 14. Since the $TiO_x$ layer may have many defects, and the TiON layer may have a low bandgap, e.g., about 2.1 eV, electrical characteristics of the dielectric layer 18 may deteriorate.

However, according to the first embodiment, a first insertion material layer 15a may first be formed on the lower metal layer 14 to fabricate the semiconductor device 200. The first insertion material layer 15a may be formed using, e.g., chemical vapor deposition (CVD), physical vapor deposition (PVD), or atomic layer deposition (ALD). The first insertion material layer 15a may, e.g., a metal film, a metal carbide film, or a metal nitride film. The metal film may include, e.g., a zirconium film. The metal carbide film may include, e.g., a zirconium carbide ($ZrC_x$) film. The metal nitride film may include, e.g., a ZrN film. The dielectric layer 18, e.g., a $ZrO_2$ film, may be formed on the insertion material layer 15a.

According to the first embodiment, the first insertion material layer 15a may be converted to the first insertion layer 16a, e.g., a $ZrO_2$ film, by an $O_3$ oxidant used during formation of the dielectric layer 18. Thus, the undesirable interface layer 30 of the first comparative embodiment may be avoided. Furthermore, when the first insertion material layer 15a includes a metal nitride film or a metal carbide film, the first insertion material layer 15a may be converted to a metal oxide film, a metal nitride film, or a metal oxide nitride film by the $O_3$ oxidant.

In the semiconductor device 200 according to the first embodiment, the first insertion material layer 15a may be preferentially oxidized by the $O_3$ oxidant. Thus, due to insufficient amount of free $O_3$ oxidant, undesirable formation of the interface layer 30 may be prevented. From a thermodynamic point of view, high activation energy may be required for the TiN film of the lower metal layer 14 to be oxidized to $TiO_x$ film or TiON film as described above with respect to the first comparative embodiment. However, since low activation energy may be required for the zirconium film of the first insertion material layer 15a to be converted to $ZrO_2$ film, the zirconium film may be preferentially oxidized by the $O_3$ gas, thereby preventing oxidation of the TiN film of the lower metal layer 14.

The first insertion material layer 15a of the semiconductor device 200 according to the first embodiment may be oxidized, i.e., converted, to the first insertion layer 16a. In particular, if the metal oxide film, i.e., the $ZrO_2$ film of the dielectric layer 18, and the metallic material film, i.e., the $ZrO_2$ film of the insertion layer 16a, are the same, a complete interface layer may be formed. Accordingly, characteristics of the dielectric layer 18 may be improved.

Figure 8:
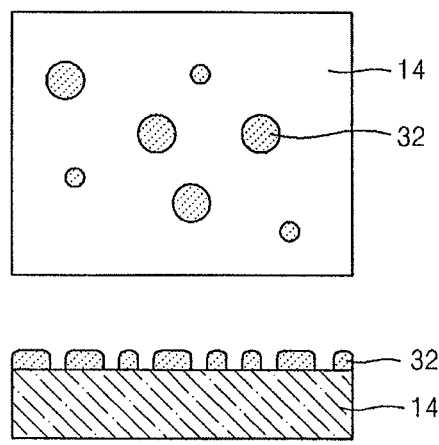
FIGS. 8 and 9 illustrate views of the semiconductor device according to the first comparative embodiment.
Figure 9:
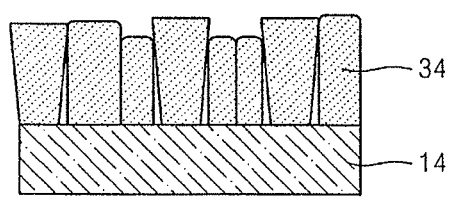
Figure 10:
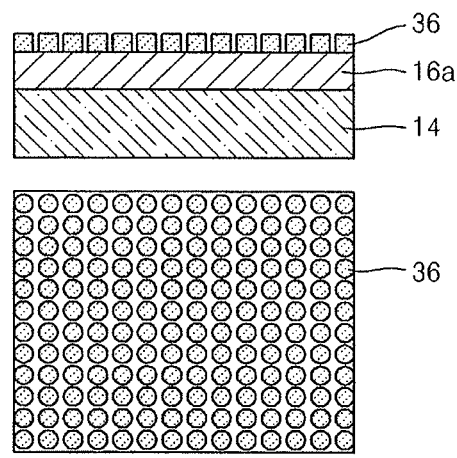
FIGS. 10 and 11 illustrate views of the semiconductor device according to the first embodiment.
Figure 11:
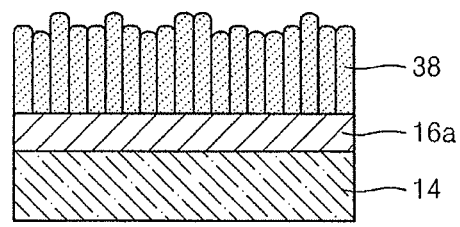

FIGS. 8 and 9 illustrate cross-sectional views of a semiconductor device according to the first comparative embodiment for comparison with the semiconductor device 200 according to the first embodiment. FIGS. 10 and 11 illustrate cross-sectional views of the semiconductor device 200 according to the first embodiment for comparison with the semiconductor device according to the first comparative embodiment.

In particular, according to the first comparative embodiment, the dielectric layer 18, e.g., a $ZrO_2$ film, may be formed on the lower metal layer 14, e.g., a TiN film. A lattice constant of the $ZrO_2$ film of the dielectric layer 18 may be about 5.09 Å. A lattice constant of the TiN film of the lower metal layer 14 may be about 4.32 Å, thereby exhibiting a large lattice constant difference between the dielectric layer 18 and the lower metal layer 14. Furthermore, a crystal structure of the $ZrO_2$ film of the dielectric layer 18 may be different from the crystal structure of the TiN film of the lower metal layer 14.

Accordingly, as illustrated in FIG. 8, a seed layer 32 may have low density and non-uniform grain size during an initial stage of deposition of the $ZrO_2$ film of the dielectric layer 18. That is, as illustrated in FIG. 8, the seed layer 32 having low density and non-uniform grain size may be formed on the lower metal layer 14 during the initial stage of deposition of the $ZrO_2$ film of the dielectric layer 18. In FIG. 8, the upper diagram illustrates a plan view; and the lower diagram illustrates a cross-sectional view. In addition, as illustrated in FIG. 9, the $ZrO_2$ film growing from the seed layer may have grains 34 with a non-uniform size; and grain boundaries formed by the grown grains 34 may not be densely formed.

In other words, since the seed layer 32 may not be densely formed on the lower metal layer 14 during the initial stage of deposition of the dielectric layer 18, the size of the grains 34 may increase; and voids may exist in the grain boundaries. Thus, the dielectric layer 18 according to the first comparative embodiment may have poor characteristics. Accordingly, electrical characteristics of the dielectric layer 18 may deteriorate during operation of the semiconductor device.

On the other hand, the first insertion material layer 15a may be formed on the lower metal layer 14 in the semiconductor device 200 according to the first embodiment. The first insertion material layer 15a may include a zirconium film as described with reference to FIG. 6. Then, the dielectric layer 18, e.g., a $ZrO_2$ film, may be formed on the first insertion material layer 15a, converting the first insertion material layer 15a to the first insertion layer 16a as described with reference to FIG. 6.

According to the fabrication process, the first insertion material layer 15a, e.g., the zirconium film, may be oxidized during the deposition of the dielectric layer 18 to form the first insertion layer 16a and a seed layer 36 as illustrated in FIG. 10. Thus, the seed layer 36 may have high density and uniform size. In FIG. 10, the upper diagram illustrates a cross-sectional view; and the lower diagram illustrates a plan view. As illustrated in FIG. 11, the $ZrO_2$ film growing from the seed layer may have grains 38 with a uniform and relatively small size; and grain boundaries formed by the grown grains 38 may be densely formed.

The dielectric layer 18 is not limited to the TiN film and the $ZrO_2$ film, and most suitable metal nitride films and metal oxide film may be used. For example, the method according to an embodiment may also be used when, e.g., a hafnium oxide ($HfO_2$) film is formed on a TiN film or a $ZrO_2$ film is formed on a TaN film.

Comparison of the Second Embodiment and the Second Comparative Embodiment

Hereinafter, characteristics of the dielectric layer 18 of the semiconductor device 220 according to the second embodiment, in which the second insertion layer 16b may be formed between the upper metal layer 20 and the dielectric layer 18, will be compared with characteristics of the dielectric layer 18 of a semiconductor device according to the second comparative embodiment, in which the upper metal layer 20 may be formed directly on the dielectric layer 18. In the second embodiment, a TiN film may be used as the upper metal layer 20, a $ZrO_2$ film may be used as the second insertion layer 16b, and a $ZrO_2$ film may be used as the dielectric layer 18. In the second comparative embodiment, a TiN film may be used as the upper metal layer 20; and a $ZrO_2$ film may be used as the dielectric layer 18

Figure 12:
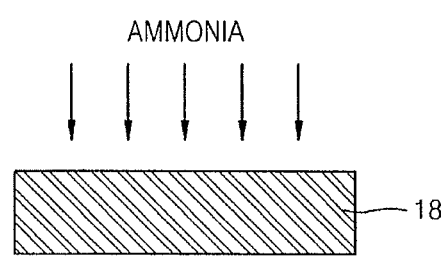
FIGS. 12 and 13 illustrate cross-sectional views of a semiconductor device according to a second comparative embodiment.
Figure 13:
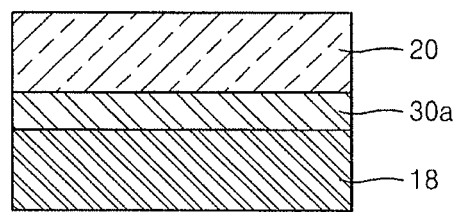
Figure 14:
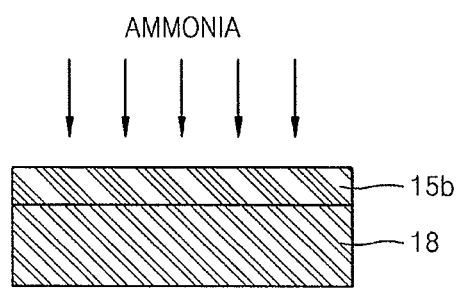
FIGS. 14 and 15 illustrate cross-sectional views of the semiconductor device according to the second embodiment.
Figure 15:
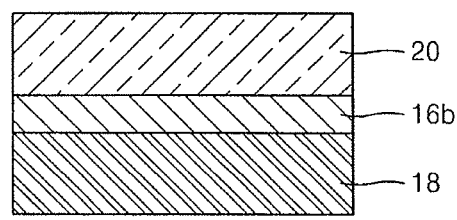

FIGS. 12 and 13 illustrate cross-sectional views of the semiconductor device according to the second comparative embodiment for comparison with the semiconductor device 220 according to the second embodiment. FIGS. 14 and 15 illustrate cross-sectional views of the semiconductor device 220 according to the second embodiment for comparison with the semiconductor device according to the second comparative embodiment.

In particular, according to the second comparative embodiment as illustrated in FIGS. 12 and 13, an upper metal layer 20, e.g., a TiN film, may be formed on a dielectric layer 18, e.g., a $ZrO_2$ film. According to the fabrication process, an interface layer 30a, e.g., a ZrON film, a $TiO_x$ film, and a TiON film, may be formed on the dielectric layer 18 by, e.g., an ammonia ($NH_3$) nitrating agent, used during formation of the upper metal layer 20 or a reaction between the upper metal layer 20 and the dielectric layer 18. The ZrON film may deteriorate interface characteristics with the upper metal layer 20, the $TiO_x$ film may have many defects, and the TiON film may have a low bandgap of, e.g., about 2.1 eV. As a result, the interface layer 30a may deteriorate electrical characteristics of the dielectric layer 18.

On the other hand, a second insertion material layer 15b may be formed on the dielectric layer 18 to form the semiconductor device 220 according to the second embodiment. The second insertion material layer 15b may be formed using, e.g., CVD, PVD, or ALD. The second insertion material layer 15b may include, e.g., a metal film, a metal carbide film, or a metal nitride film. The metal film may include, e.g., a zirconium film. The metal carbide film may include, e.g., a zirconium carbide ($ZrC_x$) film. The metal nitride film may include, e.g., a ZrN film. An upper metal layer 20 may be formed on the second insertion material layer 15b.

According to the fabrication process, the second insertion material layer 15b may be converted to the second insertion layer 16b, e.g., the ZrN film, by the $NH_3$ nitrating agent used during formation of the upper metal layer 20. The second insertion layer 16b may function as the upper metal layer 20 without adversely influencing the dielectric layer 18, unlike in the second comparative embodiment. Since the dielectric layer 18 of the semiconductor device 220 according to the second embodiment may not be damaged while the upper metal layer 20 is formed, the interface between the dielectric layer 18 and the upper metal layer 20 may have excellent characteristics when compared with the second comparative embodiment. Thus, the dielectric layer 18 may have excellent electrical characteristics.

Comparison of the Third Embodiment and the First and Second Comparative Embodiments As described above, the semiconductor device 240 according to the third embodiment may be a combination of the semiconductor device 200 according to the first embodiment and the semiconductor device 220 according to the second embodiment. Thus, the semiconductor device 240 according to the third embodiment may have the beneficial effects of both the first and second embodiments. The semiconductor device 240 according to the third embodiment may have better electrical characteristics than those of the first and second comparative embodiments.

Hereinafter, electrical characteristics of the dielectric layer 18 according to the embodiments will be compared with those according to the first and second comparative embodiments.

Figure 16:
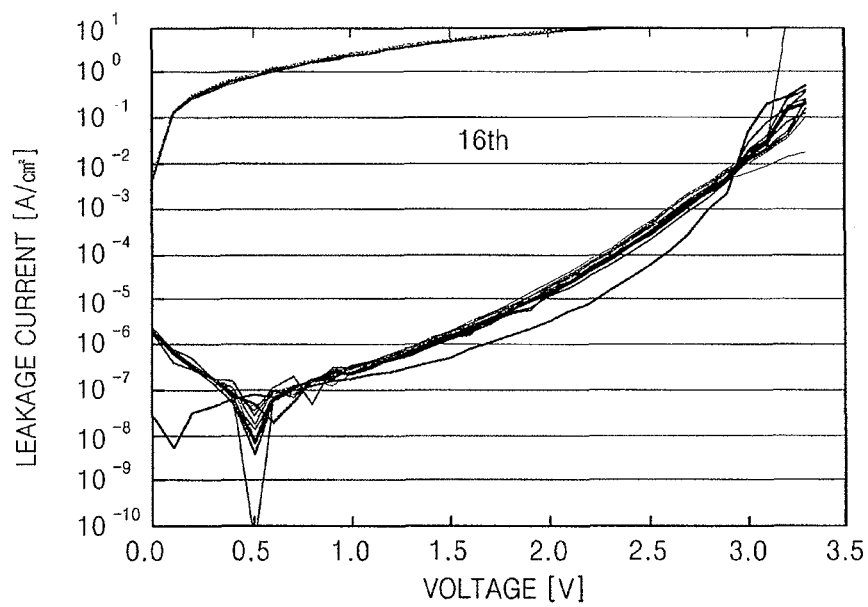
FIG. 16 illustrates a graph showing voltage and leakage current of the semiconductor device according to the first comparative embodiment.
Figure 17:
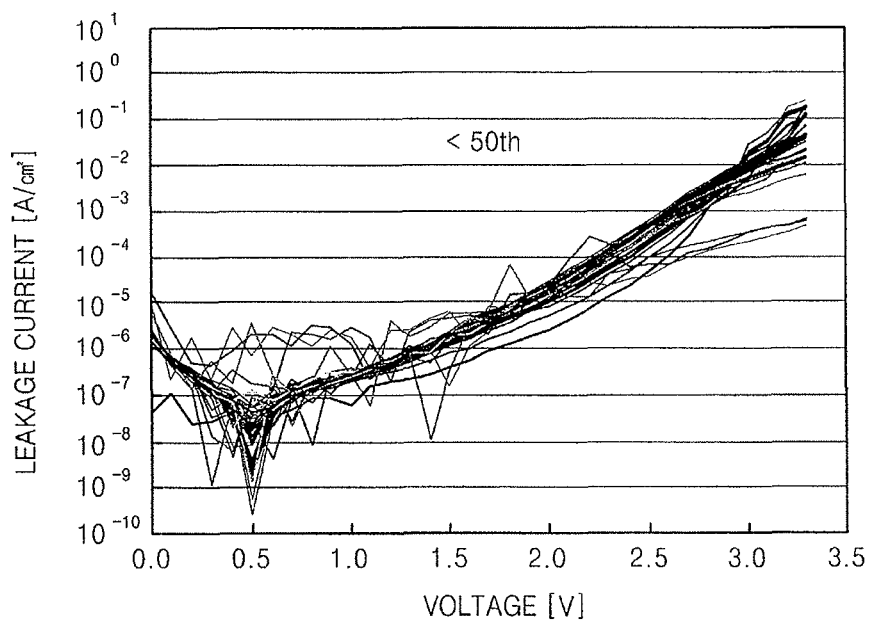
FIG. 17 illustrates a graph showing voltage and leakage current of the semiconductor device according to the first embodiment.

FIG. 16 illustrates a graph showing voltage and leakage current of the semiconductor device according to the first comparative embodiment. FIG. 17 illustrates a graph showing voltage and leakage current of the semiconductor device 200 according to the first embodiment.

Particularly, FIG. 16 illustrates a graph showing positive voltage and leakage current of a capacitor fabricated by forming a TiN film lower metal layer 14 on a semiconductor substrate 10, forming a $ZrO_2$ film dielectric layer 18 on the lower metal layer 14 to a thickness of 70 Å, and forming an upper metal layer 20 on the dielectric layer 18. In the capacitor of the first comparative embodiment, when a reference leakage current is $10^{-7}$ A/cm$^2$ at 1 V, characteristics of the dielectric layer 18 may be damaged after voltages ranging from 0 V to 3.3 V are applied 16 times to the dielectric layer 18, and thus a low leakage current is not restored.

FIG. 17 illustrates a graph showing voltage and leakage current of a capacitor fabricated by forming a TiN film lower metal layer 14 on a semiconductor substrate 10, forming a $ZrO_2$ film first insertion layer 16a on the lower metal layer 14 to a thickness of 10 Å, forming a $ZrO_2$ film dielectric layer 18 on the first insertion layer 16a to a thickness of 70 Å, and forming an upper metal layer 20 on the dielectric layer 18 as in the first embodiment. In the capacitor of the first embodiment, when a reference leakage current is $10^{-7}$ A/cm² at 1 V, characteristics of the dielectric layer 18 are maintained after voltages of about 0 V to about 3.3 V are applied 50 times to the dielectric layer 18; and thus the leakage current remains in a normal range. When comparing the results of FIGS. 16 and 17, it may be seen that electrical characteristics of the dielectric layer 18 of the capacitor according to the first embodiment are better than those according to the first comparative embodiment.

Figure 18:
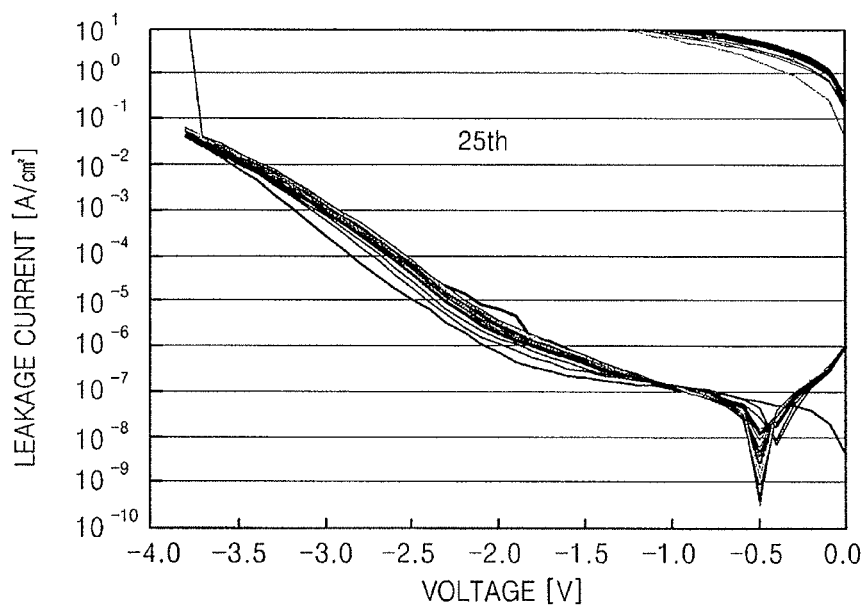
FIG. 18 illustrates a graph showing voltage and leakage current of the semiconductor device according to the second comparative embodiment.
Figure 19:
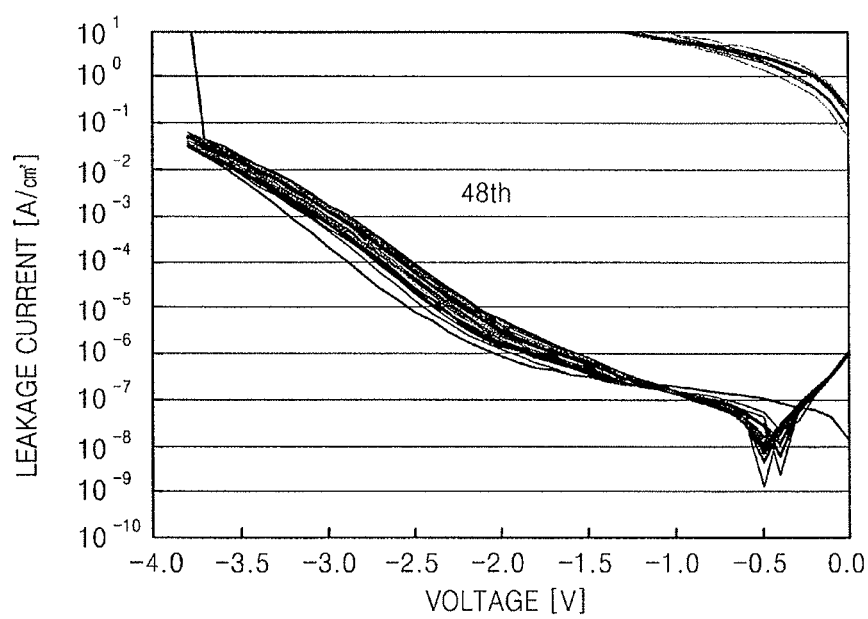
FIG. 19 illustrates a graph showing voltage and leakage current of the semiconductor device according to the second embodiment.

FIG. 18 illustrates a graph showing voltage and leakage current of the semiconductor device according to the second comparative embodiment. FIG. 19 illustrates a graph showing voltage and leakage current of the semiconductor device 220 according to the second embodiment.

Particularly, FIG. 18 illustrates a graph showing negative voltage and leakage current of a capacitor fabricated by forming a TiN film lower metal layer 14 on a semiconductor substrate 10, forming a $ZrO_2$ film dielectric layer 18 on the lower metal layer 14 to a thickness of 70 Å, and forming an upper metal layer 20 directly on the dielectric layer 18. In the capacitor of the second comparative embodiment, when a reference leakage current is $10^{-7}$ A/cm² at −1 V, characteristics of the dielectric layer 18 are damaged after voltages ranging from 0 V to −3.8 V are applied 25 times, and thus a low leakage current is not restored.

FIG. 19. illustrates a graph showing negative voltage and leakage current of a capacitor fabricated by forming a TiN film lower metal layer 14 on a semiconductor substrate 10, forming a $ZrO_2$ film dielectric layer 18 on the lower metal layer 14 to a thickness of 70 Å, forming a $ZrO_2$ film second insertion layer 16b on the dielectric layer 18 to a thickness of 10 Å, and forming an upper metal layer 20 on the second insertion layer 16b as in the second embodiment. In the capacitor of the second embodiment, when a reference leakage current is $10^{-7}$ A/cm² at −1 V, characteristics of the dielectric layer 18 are maintained after voltages ranging from 0 V to −3.8 V are applied 48 times to the dielectric layer 18; and thus the leakage current remains in a normal range. When comparing the results of FIGS. 18 and 19, it may be seen that electrical characteristics of the dielectric layer 18 of the capacitor according to the second embodiment are better than those according to the second comparative embodiment.

Application Embodiment

The capacitors fabricated according to the first, second, and/or third embodiments may be applied to semiconductor devices, e.g., DRAM devices. A DRAM device will be briefly described herein.

Figure 20:
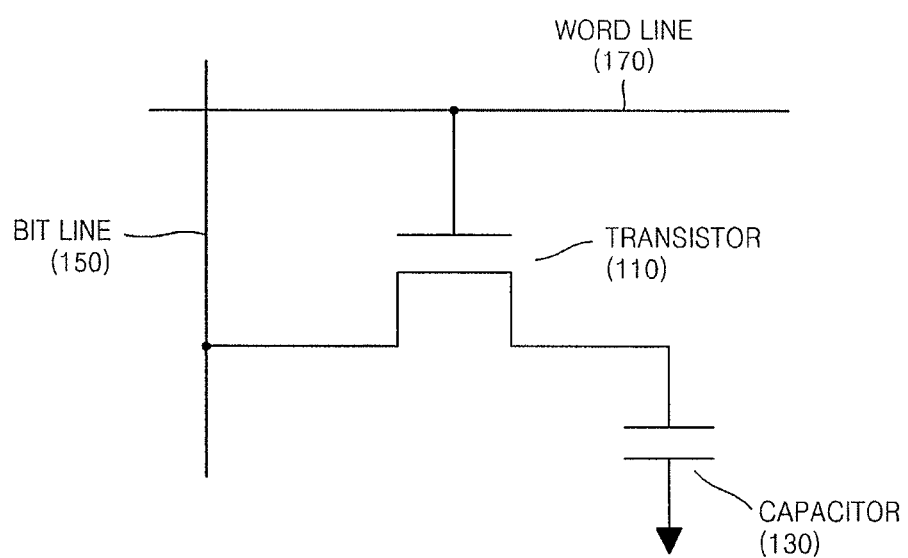
FIG. 20 illustrates a circuit diagram of a unit cell of a dynamic random access memory (DRAM) device including a transistor, according to an embodiment.

FIG. 20 illustrates a circuit diagram of a unit cell of a DRAM device including a transistor according to an embodiment.

A unit cell of a DRAM device may have various shapes. For example, the unit cell according to an embodiment may include a transistor 110 and a capacitor 130. The transistor 110 may be connected to a word line 170. A bit line 150 may be connected to a source/drain region of the transistor 110. The capacitor 130 according to Embodiments 1 to 3 described above may be connected to another source/drain region of the transistor 110. That is, the capacitor fabricated according to Embodiments 1 to 3 may be applied to a DRAM device.

The semiconductor device, e.g., the DRAM device, according to an embodiment may be applied to various fields. A DRAM chip may be fabricated by packaging the semiconductor device, e.g., the DRAM device, according to an embodiment. The DRAM chip may be applied to various fields, and examples will be described herein.

Figure 21:
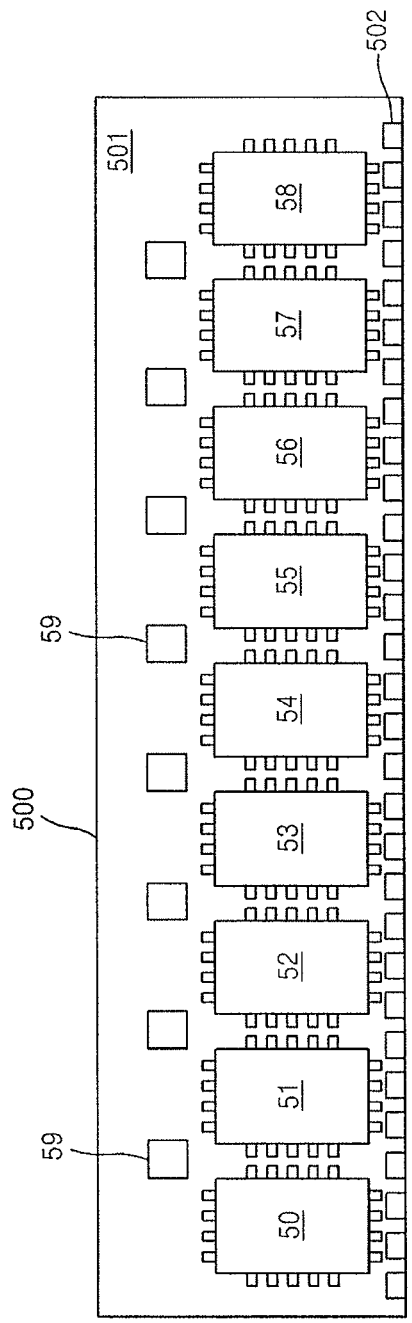
FIG. 21 illustrates a plan view of a memory module using a DRAM chip, according to an embodiment.

FIG. 21 illustrates a plan view of a memory module 500 using DRAM chips 50 to 58, according to an embodiment.

In particular, the DRAM chips 50 to 58 may be fabricated by respectively packaging the semiconductor devices according to an embodiment. The DRAM chips 50 to 58 may be applied to the memory module 500. In the memory module 500, the DRAM chips 50 to 58 may be attached to a module substrate 501. The memory module 500 may include connectors 502 which may be inserted into sockets of a motherboard, at an end of the module substrate 501 and ceramic decoupling capacitors 59 on the module substrate 501. However, the memory module 500 is not limited to the shape shown in FIG. 21 and thus may have various shapes.

Figure 22:
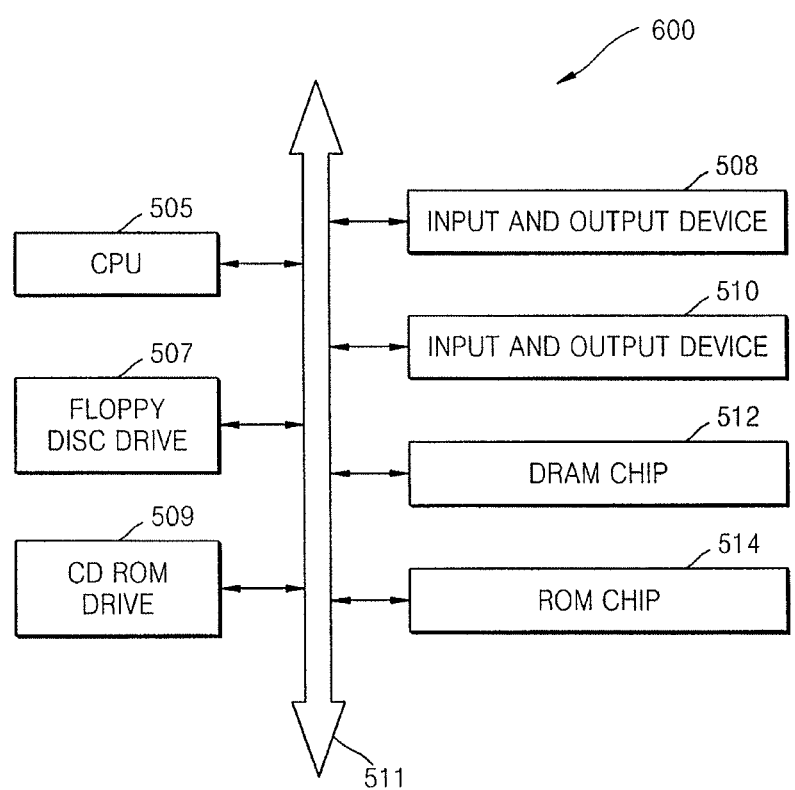
FIG. 22 illustrates a block diagram of an electronic system using a DRAM chip, according to an embodiment.

FIG. 22 illustrates a block diagram of an electronic system 600 using a DRAM chip 512 according to an embodiment.

In particular, the electronic system 600 may be a computer. The electronic system 600 may include a central processing unit (CPU) 505, a peripheral device, e.g., a floppy disc drive 507 and/or a compact disc read-only memory (CD-ROM) drive 509, input and output devices 508 and 510, the DRAM chip 512, a ROM chip 514, etc. Control signals or data may be transferred among the elements via a communication channel 511. The DRAM chip 512 may be replaced by the memory module 500 including the DRAM chips 50 to 58 as described with reference to FIG. 21.

A semiconductor device according to an embodiment may be fabricated by forming an insertion layer between a lower metal layer and a dielectric layer. When the insertion layer is formed between the lower metal layer and the dielectric layer, the formation of an interface caused by the oxidation of the lower metal layer during the formation of the dielectric layer may be prevented. Thus, characteristics of the dielectric layer may be improved, since the insertion layer may function as a seed layer for the formation of the dielectric layer.

Furthermore, the semiconductor device according to an embodiment may be fabricated by forming an insertion layer between the dielectric layer and an upper metal layer. When the insertion layer is formed between the dielectric layer and the upper metal layer, an interface layer may not be formed on the dielectric layer, and the dielectric layer may not be damaged. As a result, characteristics of the dielectric layer of the semiconductor device, including its electrical characteristics, may be improved.

As for drawbacks of other semiconductor devices and their fabrication processes, if the dielectric layer is formed at a high temperature, the high temperature may adversely affect the resultant semiconductor devices. Additionally, if heat-treatment or the oxygen curing is performed after deposition of the dielectric layer, a plurality of interface layers may be formed on a lower film under the dielectric layer. The interface layers may deteriorate electrical characteristics of the dielectric layer during the operation of the semiconductor devices, thereby increasing undesirable leakage current.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
   forming a lower metal layer on a semiconductor substrate;
   forming an insertion material layer on the lower metal layer, the insertion material layer being substantially oxygen-free as deposited;
   forming a dielectric layer on the insertion material layer; and
   forming an upper metal layer on the dielectric layer,
   wherein the insertion material layer is converted to an insertion layer including a metal oxide, a metal nitride, or a metal oxynitride during the forming of the dielectric layer.

2. The method as claimed in claim 1, wherein the insertion material layer has a lower activation energy than the lower metal layer.

3. The method as claimed in claim 2, wherein the insertion material layer includes a metal film, a metal carbide film, or a metal nitride film.

4. The method as claimed in claim 2, wherein the insertion material layer includes a zirconium film, a zirconium carbide film, or a zirconium nitride film.

5. The method as claimed in claim 1, wherein the lower metal layer includes a metal nitride.

6. The method as claimed in claim 1, wherein the insertion layer is formed by an oxidation of the insertion material layer by an $O_3$ oxidant during the forming of the dielectric layer.

7. The method as claimed in claim 6, wherein the insertion material layer prevents oxidation of the lower metal layer during forming the dielectric layer.

8. The method as claimed in claim 1, wherein the dielectric layer includes a metal oxide in the form of $MO_x$, where M is a metal, O is oxygen, and x is about 0.5 to 4.

9. The method as claimed in claim 1, wherein the dielectric layer includes a metal of the insertion material layer.

10. The method as claimed in claim 1, wherein the insertion layer has a thickness of up to about 10 Å.

11. A method of fabricating a semiconductor device, the method comprising:
    forming a lower metal layer on a semiconductor substrate;
    forming a dielectric layer on the lower metal layer;
    forming an insertion material layer on the dielectric layer, the insertion material layer being substantially oxygen-free as deposited; and
    forming an upper metal layer on the insertion material layer,
    wherein the insertion material layer is converted to an insertion layer including a metal oxide, a metal oxynitride, or a metal nitride during the forming of the upper metal layer.

12. The method as claimed in claim 11, wherein the insertion material layer includes a metal film, a metal carbide film, or a metal nitride film.

13. The method as claimed in claim 11, wherein the insertion material layer includes a zirconium film.

14. The method as claimed in claim 11, wherein the insertion layer is formed by nitrating the insertion material layer by a nitrating agent used during the forming of the upper metal layer.

15. The method as claimed in claim 11, wherein the upper metal layer includes a metal nitride.

16. The method as claimed in claim 15, wherein the dielectric layer includes a metal oxide in the form of $MO_x$, where M is a metal, O is oxygen, and x is about 0.5 to 4.

17. The method as claimed in claim 16, wherein the insertion material layer substantially prevents oxidation of the upper metal layer during the forming of the upper metal layer.

18. The method as claimed in claim 11, wherein the dielectric layer includes a metal of the insertion material layer.

19. The method as claimed in claim 11, wherein the insertion layer has a thickness of up to about 10 Å.

* * * * *